(12) United States Patent
Inai et al.

(10) Patent No.: US 10,580,915 B2
(45) Date of Patent: Mar. 3, 2020

(54) PHOTOELECTRIC CONVERSION FILM AND PHOTOELECTRIC CONVERSION DEVICE

(71) Applicant: KYOCERA Corporation, Kyoto-shi, Kyoto (JP)

(72) Inventors: Seiichiro Inai, Higashioumi (JP); Masashi Saito, Kirishima (JP); Hiromitsu Ogawa, Kirishima (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 15 days.

(21) Appl. No.: 15/777,850

(22) PCT Filed: Nov. 28, 2016

(86) PCT No.: PCT/JP2016/085159
§ 371 (c)(1),
(2) Date: May 21, 2018

(87) PCT Pub. No.: WO2017/090768
PCT Pub. Date: Jun. 1, 2017

(65) Prior Publication Data
US 2018/0351016 A1    Dec. 6, 2018

(30) Foreign Application Priority Data
Nov. 27, 2015   (JP) ................. 2015-231935

(51) Int. Cl.
*H01L 31/0352* (2006.01)
*H01L 21/02* (2006.01)
(Continued)

(52) U.S. Cl.
CPC .......... *H01L 31/0352* (2013.01); *B82Y 20/00* (2013.01); *H01L 21/02381* (2013.01);
(Continued)

(58) Field of Classification Search
CPC ............... H01L 31/0352; H01L 27/146; H01L 31/0264; H01L 51/0034; H01L 31/02366;
(Continued)

(56) References Cited

U.S. PATENT DOCUMENTS

2009/0101875 A1*  4/2009  Boyden ................. G03C 1/731
                                               252/600
2010/0226856 A1*  9/2010  Vitaliano ............. A61K 9/5169
                                               424/9.1
(Continued)

OTHER PUBLICATIONS

Yao Liu et al., "Robust functional Nanocrystal Solids by Infilling with Atomic Layer Deposition", Nano Letters., 2011, 11, pp. 5349-5355, United States.

*Primary Examiner* — Alexander O Williams
(74) *Attorney, Agent, or Firm* — Volpe and Koenig, P.C.

(57) ABSTRACT

According to the present disclosure, a photoelectric conversion film includes a plurality of semiconductor nanoparticles and a matrix phase provided around each of the plurality of semiconductor nanoparticles. The matrix phase includes a principal phase including a composite, which includes an organic molecule polymer and an inorganic material. A photoelectric conversion device includes a transparent electrically conductive film, a photoelectric conversion layer, a semiconductor substrate, and an electrode layer, which are layered on a glass substrate in this order. The photoelectric conversion layer includes the photoelectric conversion film.

11 Claims, 5 Drawing Sheets

(51) Int. Cl.
*B82Y 20/00* (2011.01)
*H01L 51/42* (2006.01)
*H01L 31/0384* (2006.01)
*H01L 27/146* (2006.01)
*H01L 31/0236* (2006.01)
*H01L 31/0264* (2006.01)
*H01L 51/00* (2006.01)
*B82Y 10/00* (2011.01)

(52) U.S. Cl.
CPC .. *H01L 21/02568* (2013.01); *H01L 21/02601* (2013.01); *H01L 21/02628* (2013.01); *H01L 27/146* (2013.01); *H01L 31/0264* (2013.01); *H01L 31/02366* (2013.01); *H01L 31/0384* (2013.01); *H01L 31/035218* (2013.01); *H01L 51/0034* (2013.01); *H01L 51/426* (2013.01); *B82Y 10/00* (2013.01)

(58) Field of Classification Search
CPC .......... H01L 21/02601; H01L 31/0384; H01L 21/02381; H01L 21/02568; H01L 21/026628; H01L 51/426; H01L 21/035218; H01L 21/02; H01L 51/42; H01L 31/0236; H01L 51/00; B82Y 10/00; B82Y 20/00

USPC .......................................................... 257/9
See application file for complete search history.

(56) References Cited

U.S. PATENT DOCUMENTS

| | | | | |
|---|---|---|---|---|
| 2012/0125414 | A1* | 5/2012 | Kamezaki | H01G 9/2072 136/255 |
| 2012/0263793 | A1* | 10/2012 | Vitaliano | G01N 21/554 424/490 |
| 2015/0083210 | A1* | 3/2015 | Arai | H01L 51/0061 136/256 |
| 2015/0362635 | A1* | 12/2015 | Toriyama | G02B 5/0268 438/29 |
| 2016/0293783 | A1* | 10/2016 | Shiomi | H01L 21/0256 |
| 2017/0210981 | A1* | 7/2017 | Goan | B82Y 30/00 |
| 2018/0097029 | A1* | 4/2018 | Kurihara | H01L 27/14627 |
| 2018/0163318 | A1* | 6/2018 | Kamo | B32B 7/02 |
| 2018/0238519 | A1* | 8/2018 | Kuniyasu | F21V 9/40 |
| 2018/0298278 | A1* | 10/2018 | Zhong | B82Y 20/00 |
| 2018/0330890 | A1* | 11/2018 | Tanaka | H01L 51/4273 |

* cited by examiner

PHOTOELECTRIC CONVERSION FILM AND PHOTOELECTRIC CONVERSION DEVICE

TECHNICAL FIELD

The present disclosure relates to a photoelectric conversion film and a photoelectric conversion device.

BACKGROUND ART

For photoelectric conversion devices, such as photovoltaic cells and semiconductor lasers, use of quantum dots has been proposed recently to enhance the photoelectric conversion efficiency. Representative examples of quantum dots that are utilized for photoelectric conversion devices, such as photovoltaic cells, include semiconductor nanoparticles having a size of approximately 10 nm. When semiconductor nanoparticles are to be used as quantum dots for photovoltaic cells, the semiconductor nanoparticles need to have a passivation film (e.g., aluminum oxide) on a surface thereof. Examples of methods for forming such an inorganic passivation film include atomic layer deposition (hereinafter referred to as ALD).

ALD is performed as follows. Semiconductor nanoparticles are deposited on a substrate to form an integrated film, and a vaporized organometallic compound, together with a gas such as oxygen, is spayed on top of the integrated film. Thus, an inorganic material is formed between the semiconductor nanoparticles (see, for example, Non-Patent Literature 1).

In such a case, a surface treatment for enhancing dispersibility is performed on the semiconductor nanoparticles for forming a photoelectric conversion film, to enable the semiconductor nanoparticles to be arranged at high density when being deposited on the substrate. For example, low molecular weight organic molecules, referred to as ligands, may be applied to surfaces of the semiconductor nanoparticles. A composite material may be thus formed and used. Further, an inorganic material is formed to fill a region around each of such semiconductor nanoparticles and organic molecules.

CITATION LIST

Non-Patent Literature

Non-Patent Literature 1: Yao Liu, "Robust functional Nanocrystal Solids by Infilling with Atomic Layer Deposition", U.S.A., Nano Lett. 2011, 11, 5349-5355

SUMMARY OF INVENTION

According to the present disclosure, a photoelectric conversion film includes a plurality of semiconductor nanoparticles and a matrix phase existing around each of the plurality of semiconductor nanoparticles. The matrix phase includes a principal phase including a composite including a polymer of organic molecules and an inorganic material.

According to a present disclosure, a photoelectric conversion device includes a transparent electrically conductive film, a photoelectric conversion layer, a semiconductor substrate, and an electrode layer, on a light-transmissive substrate. The transparent electrically conductive film, the photoelectric conversion layer, the semiconductor substrate, and the electrode layer are layered in this order. The photoelectric conversion layer includes the photoelectric conversion film.

BRIEF DESCRIPTION OF DRAWINGS

FIG. 5A illustrates a structure in which an inorganic material extends throughout an integrated film. FIG. 5B illustrates a structure in which an inorganic material occupies a portion of an integrated film.

DESCRIPTION OF EMBODIMENT

Figure 1A:
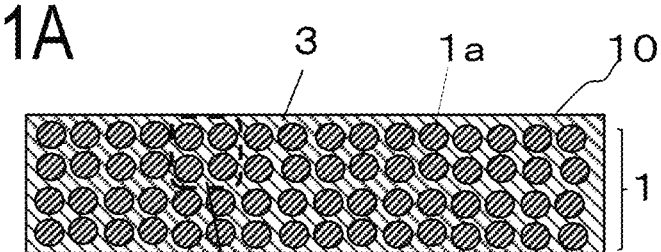
FIG. 1A is a schematic cross-sectional view of an embodiment of the photoelectric conversion film according to the present disclosure.
Figure 1B:
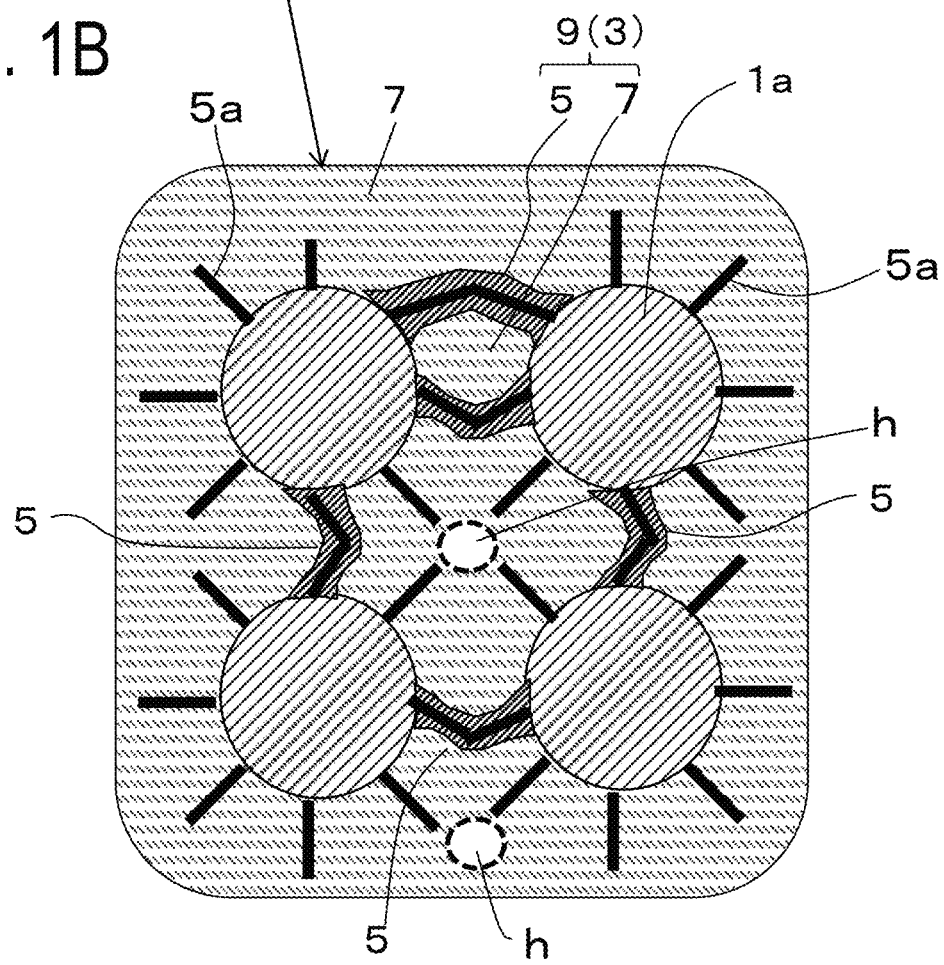
FIG. 1B is an enlarged cross-sectional view of a portion of FIG. 1A.

FIG. 1A is a schematic cross-sectional view of an embodiment of the photoelectric conversion film according to the present disclosure. FIG. 1B is an enlarged cross-sectional view of a portion of FIG. 1A.

A photoelectric conversion film 10 of the present embodiment includes a plurality of semiconductor nanoparticles 1a and a matrix phase 3. The matrix phase 3 exists around each of the semiconductor nanoparticles 1a. Herein, for convenience, the structure in which the plurality of semiconductor nanoparticles 1a collect together is referred to as an integrated film 1.

In the matrix phase 3, which is included in the photoelectric conversion film 10, a principal phase thereof is formed of a composite 9. The composite 9 is formed of a polymer 5 of organic molecules (hereinafter referred to as organic molecule polymer 5) and an inorganic material 7. Herein, the composite 9 is referred to as principal phase when the composite 9 constitutes 60% or greater volume fraction in the matrix phase 3. The polymer 5 of organic molecules is hereinafter referred to as the organic molecule polymer 5. The organic molecule polymer 5 is formed of a plurality of organic molecules 5a bonded to one another.

The volume fraction of the composite 9 in the matrix phase 3 can be determined by image interpretation. The image can be obtained through observation, using a transmission electron microscope, of a cross section of the photoelectric conversion film 10. The area fraction, which is thus obtained, corresponds to the volume fraction.

The state of presence, including the structures, of the organic molecule polymer 5 and the inorganic material 7 included in the matrix phase 3, are identified by analysis using any one of, or a combination of any of the following: an analyzer included in a transmission electron microscope; Fourier transform infrared attenuated total reflection spectroscopy (FT-IR-ATR); and gas chromatography-mass spectrometry (GC-MS).

Figure 2:
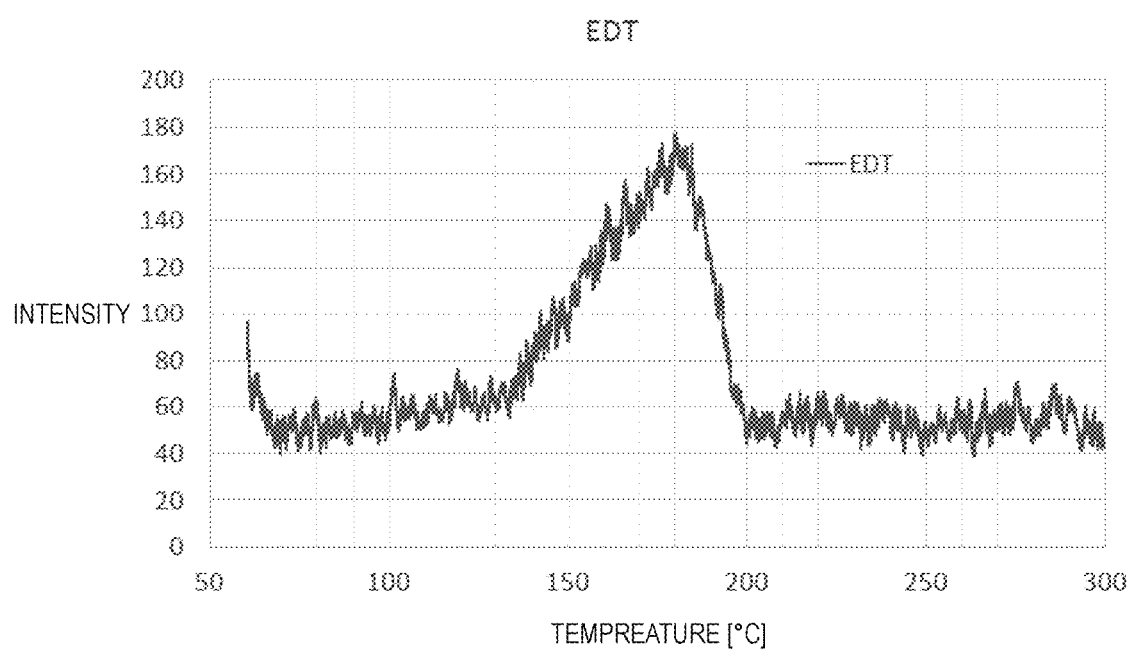
FIG. 2 shows a vaporization curve of heated EDT being an example of organic molecules.

Here, a comparison is made between the photoelectric conversion film 10 of the present embodiment and the aforementioned known photoelectric conversion film disclosed in Non-Patent Literature 1. FIG. 2 shows a vaporization curve of heated ethanedithiol (($C_2H_6S_2$, hereinafter abbreviated as EDT)) being an example of the organic molecules 5a. The curve was obtained by gas chromatography measurement. As shown in FIG. 2, EDT begins to gradually vaporize at a temperature approximately slightly higher than 70° C., vaporizes rapidly in the range from 130° C. to 180° C., and finish vaporizing at 200° C. or higher.

According to Non-Patent Literature 1, for the known photoelectric conversion film, the inorganic material (aluminum oxide in this case) is formed at a temperature of 70° C. As can be seen from the vaporization curve shown in FIG. 2, EDT does not substantially vaporize at such a temperature. Thus, in the known photoelectric conversion film disclosed in Non-Patent Literature 1, the organic molecules applied to the surfaces of the semiconductor nanoparticles exist, with the molecular weight thereof being substantially the same as the molecular weight prior to film forming by ALD. As a result, the inorganic material formed by ALD at best penetrates into gaps between organic molecules, which extend from adjacent semiconductor nanoparticles.

That is, in the case of the known photoelectric conversion film, even at the stage of inorganic material formation within the integrated film of the semiconductor nanoparticles by ALD, large amounts of low molecular weight organic molecules remain between the semiconductor nanoparticles. As a result, it is difficult to form the inorganic material around each of the semiconductor nanoparticles. Thus, the inorganic material has a low capability to function as a passivation film and low ability to serve as a current collector film. Consequently, the photoelectric conversion characteristics are not enhanced.

In addition, in the known photoelectric conversion film, organic molecules extending from adjacent semiconductor nanoparticles 101a are not polymerized and are merely entangled with each other. Thus, there are large variations in the spacings between adjacent semiconductor nanoparticles.

Furthermore, in the known photoelectric conversion film, adjacent semiconductor nanoparticles are not tightly connected to each other. Thus, when the inorganic material is formed by ALD in a film in which semiconductor nanoparticles are integrated, the following occurs. When the inorganic material is formed in the gaps between semiconductor nanoparticles, the spacings between semiconductor nanoparticles increase corresponding to lengths organic molecules extend. As a result, the inorganic material formed between semiconductor nanoparticles also has a large thickness. Consequently, the inorganic material formed around each of the semiconductor nanoparticles has a low capability to function as a passivation film. Thus, the photoelectric conversion film has a reduced carrier confinement effect, and as a result, the photoelectric conversion characteristics are not enhanced.

In contrast, for the photoelectric conversion film 10 of the present embodiment, the inorganic material 7 is formed by ALD at a temperature higher than 70° C., as will be appreciated from the specific examples described later. When the inorganic material 7 is formed at a temperature higher than 70° C., the organic molecules 5a (here, EDT) readily vaporize. This results in elimination of some of the EDT molecules around each of the semiconductor nanoparticles 1a. Thus, the number of EDT molecules existing between semiconductor nanoparticles 1a is reduced. Consequently, a space h, in which the inorganic material 7 can be formed, is increased. The space h can be occupied by the inorganic material 7.

Furthermore, in the case that the temperature for forming the inorganic material 7 is set to a temperature higher than 70° C., sulfur (S) is eliminated from one side of the EDT and thus carbon chains are formed. Thus, carbon chains are formed by polycondensation. As a result, tighter connection is formed between organic molecules 5a.

As described above, the organic molecule polymer 5 is formed by polycondensation of the organic molecules 5a. Between adjacent semiconductor nanoparticles 1a, the organic molecules 5a extend to face each other. The resulting length of the organic molecules 5a is reduced, corresponding to the polycondensation due to elimination of sulfur.

In the photoelectric conversion film 10 of the present embodiment, the inorganic material 7 is formed between adjacent semiconductor nanoparticles 1a. The thickness of the formed inorganic material 7 corresponds to the length of the organic molecule polymer 5, to which the inorganic material 7 is connected. Thus, the inorganic material 7 has a thickness smaller than the thickness of the inorganic material of Non-Patent Literature 1. Thus, in the photoelectric conversion film 10 of the present embodiment, carrier spreading from the semiconductor nanoparticles 1a is facilitated, and consequently the photoelectric conversion characteristics are improved.

As illustrated in FIG. 1B, both the organic molecule polymer 5 and the inorganic material 7 included in the composite 9 may be in contact with a plurality of adjacent semiconductor nanoparticles 1a. When the organic molecule polymer 5 and the inorganic material 7 are in contact with a plurality of adjacent semiconductor nanoparticles 1a, the organic molecule polymer 5 can serve as a connection member for tightly connecting adjacent semiconductor nanoparticles 1a together. As a result, the organic molecule polymer 5 has a high capability to function as a passivation film.

In the composite 9, in cross-sectional view of the photoelectric conversion film 10, the area fraction of the inorganic material 7 may be larger than the area fraction of the organic molecule polymer 5. When, in the composite 9, the area fraction of the inorganic material 7 is larger than the area fraction of the organic molecule polymer 5, the bond strength between a plurality of adjacent semiconductor nanoparticles 1a further increases. Consequently, the photoelectric conversion film, which has high mechanical strength and good durability, can be obtained.

Figure 3:
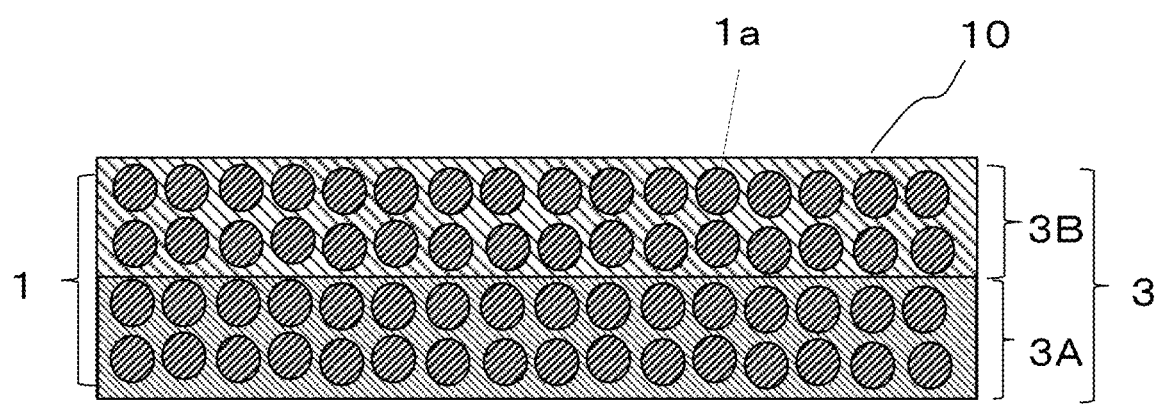
FIG. 3 is a partial cross-sectional view illustrating an inorganic material existing in a photoelectric conversion film, up to a position middle of the photoelectric conversion film in a thickness direction.

FIG. 3 is a partial cross-sectional view illustrating an inorganic material existing in a photoelectric conversion film, up to a position middle of the photoelectric conversion film in a thickness direction. In FIG. 3, reference numeral 3A denotes a region where both the organic molecule polymer 5 and the inorganic material 7 exist as the matrix phase 3 (coexistence region), and 3B denotes a region where the organic molecule polymer exists singly (single region). In the photoelectric conversion film 10 illustrated in FIG. 3, the occupied areas and occupied regions of the organic molecule polymer 5 and the inorganic material 7, relative to the total area of the integrated film 1, differ between the coexistence region 3A and the single region 3B.

In the photoelectric conversion film 10 illustrated in FIG. 3, the organic molecule polymer 5 and the inorganic material 7 are not chemically bonded to each other and are formed structurally different from each other. In the photoelectric conversion film 10 of the present embodiment, the organic molecule polymer 5 exists around substantially each of all the semiconductor nanoparticles 1a and fills the region. On the other hand, the inorganic material 7 is formed to extend from one of the principal surfaces of the integrated film 1 to a position middle in the thickness direction. The region occupied by the inorganic material 7 is within a limited range in the thickness direction, as illustrated in FIG. 3.

In other words, in the configuration, the inorganic material 7 exists from one of the principal surfaces of the integrated film 1 over a range up to a certain thickness, and the inorganic material 7 is absent in the remainder of the integrated film 1. In the configuration, the composite 9 may be such that, in cross-sectional view of the photoelectric conversion film 10, the region 3A and the region 3B are layered. In the region 3A, both the polymer 5 of organic molecules and the inorganic material 7 exist. In the region 3B, the polymer of organic molecules exist singly.

For the photoelectric conversion film 10 illustrated in FIG. 3, an n-type semiconductor, for example, may be used as the inorganic material 7 to form the composite 9. As a result, in the formed photoelectric conversion film 10, the inorganic material 7 may function as a current collector.

In the photoelectric conversion film 10, the area fraction of the region of reference numeral 3A, in which both the organic molecule polymer 5 and the inorganic material 7 exist, may be larger than the area fraction of the region of reference numeral 3B, in which the organic molecule polymer 5 exists singly. This configuration improves current collection capability. This is because the proportion of the semiconductor nanoparticles 1a that are in contact with the inorganic material 7, which serves as a current collector, increases in the matrix phase 3.

Figure 4:
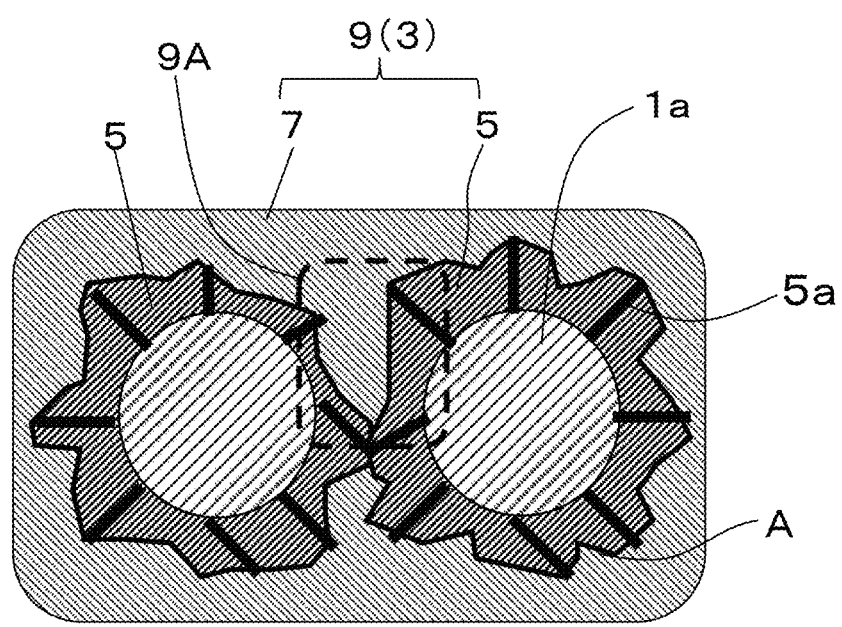
FIG. 4 is a schematic cross-sectional view of another form of the photoelectric conversion film according to the present embodiment.

FIG. 4 is a schematic cross-sectional view of another form of the photoelectric conversion film according to the present embodiment. FIG. 4 illustrates a portion of the photoelectric conversion film 10. In the configuration of the photoelectric conversion film 10 illustrated in FIG. 4, the organic molecule polymer 5 predominantly adheres to the surfaces of the semiconductor nanoparticles 1a. In the configuration, the inorganic material 7 exists in the region outside the organic molecule polymer 5. Such an organic molecule polymer 5 is more likely to form as the temperature for forming the inorganic material 7 increases. This is because an increase in temperature promotes poly condensation of the organic molecules 5a with each other.

In the configuration, the composite 9 in the photoelectric conversion film 10 may include a layered portion 9A formed between adjacent semiconductor nanoparticles 1a, to the extent that a significant degradation of the photoelectric conversion characteristics does not occur. In the layered portion 9A, the organic molecule polymer 5 and the inorganic material 7 may be layered. The layered portion 9A may be a three layer structure in which the organic molecule polymer 5, the inorganic material 7, and the organic molecule polymer 5 are disposed in this order.

In the case of the photoelectric conversion film 10 illustrated in FIG. 4, the organic molecule polymer 5 is formed in the composite 9, which serves as the matrix phase 3, after receiving high energy in heating. Thus, the organic molecule polymer 5 is more tightly bonded to the surfaces of adjacent semiconductor nanoparticles 1a and also to the inorganic material 7. Consequently, the photoelectric conversion film, which has enhanced photoelectric conversion characteristics, is obtained.

The organic molecule 5a for forming the organic molecule polymer 5 may be a compound having 40 or less carbon atoms, such as tetrabutylammonium iodide (TBAI) and EDT described above. The reason is that the spacing between semiconductor nanoparticles can be reduced. Further, in such a case, the organic molecule 5a may have 5 or less carbon atoms and straight chained.

The inorganic material 7 may include a compound including an element selected from the group consisting of Al, Zn, Si, Ti, Cu, Ga, S, In, and Se and an element selected from the group consisting of O, C, and N. Specific examples of the inorganic material 7, which is formed by ALD, include AlOx, AlNx, ZnOx, SiOx, SiNx, TiOx, TiNx, CuOx, GaOx, GaNx, GaSex, InSx, and InSex (x is any number, based on the atmosphere for film forming, and may be, for example, from 0.1 to 3). In the inorganic material 7, anions, such as oxygen anions, may be present in a non-stoichiometric ratio.

In the configuration, the composite 9 in the photoelectric conversion film 10 may include a layered portion 9A formed between adjacent semiconductor nanoparticles 1a, to the extent that a significant degradation of the photoelectric conversion characteristics does not occur. In the layered portion 9A, the organic molecule polymer 5 and the inorganic material 7 may be layered. The layered portion 9A may be a three layer structure in which the organic molecule polymer 5, the inorganic material 7, and the organic molecule polymer 5 are disposed in this order.

A semiconductor material, such as described above, is used for the integrated film 1. The proportion of the semiconductor nanoparticles 1a in the integrated film 1 may be 60% or greater in terms of area fraction. The area fraction may be obtained through observation of a cross section of the integrated film 1. In the case that the area fraction of the semiconductor nanoparticles 1a is 60% or greater, the particle size distribution may be within a range of 5 nm or less provided that the maximum diameter is 10 nm.

Figure 5A:
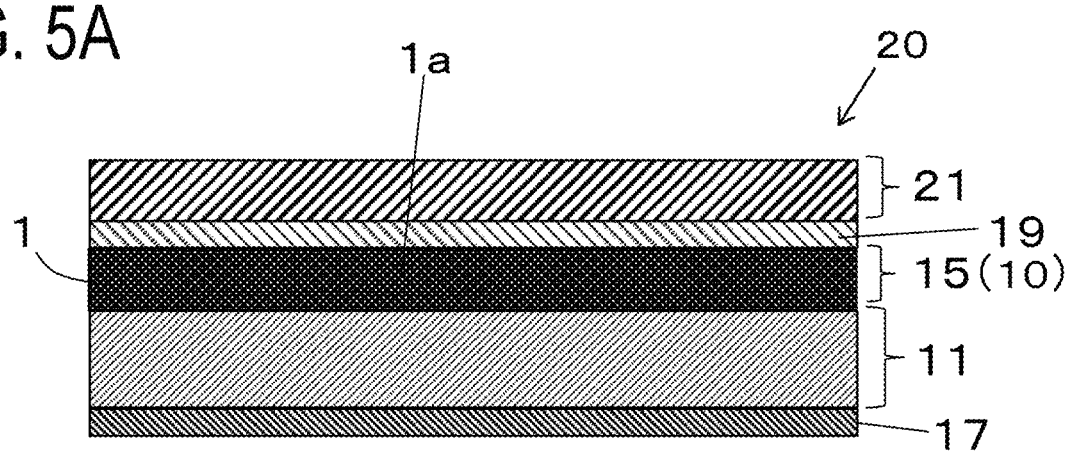
FIGS. 5A and 5B are schematic cross-sectional view of an embodiment of the photoelectric conversion device according to the present disclosure.
Figure 5B:
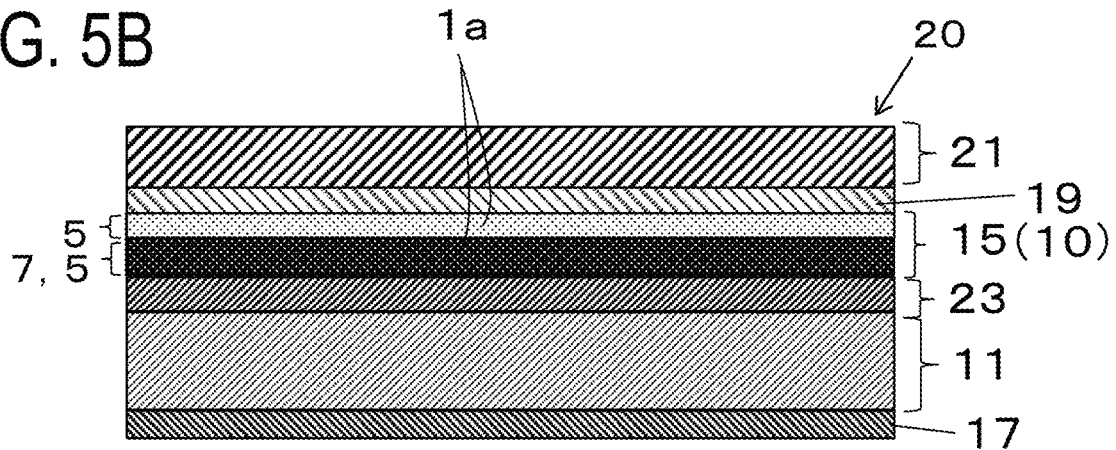

FIGS. 5A and 5B are schematic cross-sectional views of an embodiment of the photoelectric conversion device according to the present disclosure. FIG. 5A illustrates a structure in which an inorganic material extends throughout an integrated film. FIG. 5B illustrates a structure in which an inorganic material occupies a portion of an integrated film. According to the present embodiment, a photoelectric conversion device 20 includes a photoelectric conversion layer 15 on a principal surface of a semiconductor substrate 11. The photoelectric conversion layer 15 includes the photoelectric conversion film described above. In the example illustrated in FIG. 5A, an electrode layer 17 is disposed under a lower surface of the semiconductor substrate 11. A transparent electrically conductive film 19 and a glass substrate 21 are disposed in this order over an upper surface of the photoelectric conversion layer 15. In the photoelectric conversion device 20, the photoelectric conversion layer 15 includes the photoelectric conversion film 10 described above. That is, the matrix phase 3 includes the composite 9, which is the principal phase. The composite 9 includes the organic molecule polymer 5 and the inorganic material 7. Thus, the matrix phase 3, which occupies the space between semiconductor nanoparticles 1a, tightly connects adjacent semiconductor nanoparticles 1a together, and therefore has a high capability to function as a passivation film. Consequently, high photoelectric conversion characteristics are obtained.

On the other hand, the photoelectric conversion device 20 illustrated in FIG. 5B includes the photoelectric conversion film illustrated in FIG. 3, which serves as the photoelectric conversion layer 15. This photoelectric conversion device 20 includes a current collector layer 23, which is provided between the semiconductor substrate 11 and the photoelectric conversion layer 15. In the configuration, the current collector layer 23 may include the same material (primary component) as the material of the inorganic material 7. The material of the current collector layer 23 and the inorganic material 7 may be, for example, zinc oxide. In other words, in the photoelectric conversion device 20 illustrated in FIG. 5B, zinc oxide may be present throughout the current collector layer 23, and may be present in the photoelectric conversion layer 15, up to a position middle in the thickness direction. That is, zinc oxide may be present, up to a position of from 50 to 90% of the thickness in the photoelectric conversion layer 15. In the current collector layer 23, zinc oxide may be in a film form, and in the photoelectric conversion layer 15, zinc oxide may be in a columnar form in cross-sectional view and fill the region around each of the semiconductor nanoparticles 1a. The current collector layer 23 and the inorganic material 7 may be integrated with each other. Consequently, the photoelectric conversion device which has a high short-circuit current density and a high open circuit voltage of the photoelectric conversion device can be obtained.

Examples

Next, a method for producing the photoelectric conversion film and the photoelectric conversion device of the present embodiment will be described based on an example in which lead sulfide (PbS) was used as the semiconductor nanoparticles 1.

First, lead sulfide particles (hereinafter referred to as PbS particles) dispersed in a solution of polyoxyethylene having a molecular weight of approximately 200 were prepared. The average particle size was approximately 10 nm.

Next, EDT was added to the PbS particle-containing solution, and stirring was performed at room temperature for approximately 24 hours. As a result of this operation, the EDT was substituted for polyoxyethylene on the surfaces of the PbS particles. Thus, a nano-composite material including PbS particles and EDT bonded thereto was obtained.

Next, the resultant dispersion solution of the nano-composite material was applied to a silicon substrate having an area of 10 mm×10 mm and a thickness of 0.3 mm. Thereafter, the substrate was subjected to cleaning and heating to remove extra organic molecules and moisture. Thus, the integrated film 1 was formed. The thickness of the integrated film was approximately 0.1 μm.

Next, the inorganic material was formed around each of the PbS particles in the integrated film 1 by ALD. The conditions for ALD were as follows. The pressure of oxygen (O) gas supplied was 5 Pa and the substrate temperature was varied within the range shown in Table 1. In this manner, a photoelectric conversion film was formed. In the photoelectric conversion film, the integrated film of PbS particles formed on the silicon substrate included a matrix phase including a composite of EDT and ZnOx. The ZnOx film was formed up to a position of approximately ¾ from the upper surface of the integrated film, by controlling the duration of film forming and the cycle number. Also, a sample in which a current collector layer of zinc oxide was formed between the semiconductor substrate and the photoelectric conversion film was formed by applying, in advance, a solution of zinc oxide to the surface of the semiconductor substrate and heating the semiconductor substrate at approximately 100° C.

Next, the internal structure of the produced photoelectric conversion film was observed with a transmission electron microscope. The state of polymerization of the organic molecules (EDT) was checked by total reflection Fourier transform infrared spectroscopy (FT-IR-ATR).

Next, a photoelectric conversion device was produced as follows. A transparent electrically conductive film (indium tin oxide: ITO) was formed on the surface of the photoelectric conversion film, and next, a glass substrate was adhered thereto. An electrode layer (gold: Au) was formed on the lower surface of the silicon substrate by a vapor deposition method.

Next, the short-circuit current density of the produced photoelectric conversion device was evaluated.

TABLE 1

| Sample No. | Heating temperature ° C. | Short-circuit current density mA/cm$^2$ | Remarks |
|---|---|---|---|
| 1 | 70 | 22 | EDT not polymerized |
| 2 | 130 | 29 | — |
| 3 | 150 | 32 | — |
| 4 | 180 | Not evaluated | EDT totally vaporized |

As is apparent from the results in Table 1, samples (Sample Nos. 2 and 3) that were produced by setting the film-forming temperature for performing ALD to 130° C. and 150° C., respectively, had a short-circuit current density of not less than from 29 to 32 mA/cm$^2$. The obtained short-circuit current density was from 1.3 to 1.5 times greater than the short-circuit current density, 22 mA/cm$^2$, of a sample (Sample No. 1), which was produced at a temperature set at 70° C.

FT-IR-ATR analysis of the photoelectric conversion film of each of the samples revealed that, in the respective samples for which the ALD film-forming temperature was set to 130° C. and 150° C., EDT had been polymerized, whereas, in the sample for which the temperature was set to 70° C., EDT had not been polymerized. From a sample for which the temperature was set 180° C., EDT had been totally vaporized.

The photoelectric conversion film of each of the samples was observed with a transmission electron microscope and the following was found. In the respective samples (Sample Nos. 2 and 3) produced by setting the film-forming temperature for performing ALD to 130° C. and 150° C., EDT (polymer) and ZnOx, which formed the composite in the photoelectric conversion film, were both in contact with at least two PbS particles. Also, the area fraction of ZnOx was larger than the area fraction of EDT (polymer).

From the sample of the photoelectric conversion device of Sample No. 3, a photoelectric conversion device having the configuration illustrated in FIG. 5B was produced and evaluated in the same manner. It was found that the short-circuit current density was 36 mA/cm$^2$. In this sample, in cross-sectional view, the region in which both the polymer of organic molecules and the inorganic material existed and the region in which the polymer of organic molecules existed singly were formed in layers. Also, the area fraction of the region in which both the organic molecule polymer and the inorganic material existed was larger than the area fraction of the region in which the organic molecule polymer existed singly. Further, it was observed that the composite of this sample included, partially, a structure of layered films, which included the organic molecule polymer, the inorganic material, and the organic molecule polymer that were disposed in this order.

REFERENCE SIGNS LIST

10 Photoelectric conversion film
20 Photoelectric conversion device
1 Integrated film
1a Semiconductor nanoparticles
3 Matrix phase 5 Organic molecule polymer
5a Organic molecule
7 Inorganic material
9 Composite
11 Semiconductor substrate
15 Photoelectric conversion layer
17 Electrode layer
19 Transparent electrically conductive film
21 Glass substrate

The invention claimed is:

1. A photoelectric conversion film comprising:
a plurality of semiconductor nanoparticles; and
a matrix phase existing around each of the plurality of semiconductor nanoparticles,
wherein the matrix phase comprises a principal phase comprising a composite comprising a polymer of organic molecules and an inorganic material.

2. The photoelectric conversion film according to claim 1, wherein both the polymer of organic molecules and the inorganic material of the composite are in contact with a plurality of adjacent ones of the plurality of semiconductor nanoparticles.

3. The photoelectric conversion film according to claim 1, wherein, in the composite, in cross-sectional view, an area fraction of the inorganic material is larger than an area fraction of the polymer of organic molecules.

4. The photoelectric conversion film according to claim 1, wherein the inorganic material exists in the matrix phase, from one of principal surfaces of the integrated film to a position middle in a thickness direction.

5. The photoelectric conversion film according to claim 1, wherein, in the matrix phase, in cross-sectional view, a region in which both the polymer of organic molecules and the inorganic material exist and a region in which the polymer of organic molecules exists singly are layered.

6. The photoelectric conversion film according to claim 5, wherein an area fraction of the region in which both the polymer of organic molecules and the inorganic material exist is larger than the area fraction of the region in which the polymer of organic molecules exists singly.

7. The photoelectric conversion film according to claim 1, further comprising a layered portion between adjacent ones of the plurality of semiconductor nanoparticles, wherein
in the layered portion, the polymer of organic molecules and the inorganic material are layered.

8. The photoelectric conversion film according to claim 1, wherein each of the organic molecules has 40 or less carbon atoms.

9. The photoelectric conversion film according to claim 1, wherein each of the organic molecules has 5 or less carbon atoms and is straight chained.

10. The photoelectric conversion film according to claim 1,
wherein the inorganic material comprises a compound comprising an element selected from the group consisting of Al, Zn, Si, Ti, Cu, Ga, S, In, and Se and an element selected from the group consisting of O, C, and N.

11. A photoelectric conversion device comprising:
a transparent electrically conductive film;
a photoelectric conversion layer;
a semiconductor substrate; and
an electrode layer,
wherein the transparent electrically conductive film, the photoelectric conversion layer, the semiconductor substrate, and the electrode layer are provided on a light-transmissive substrate and layered in this order, and
the photoelectric conversion layer comprises the photoelectric conversion film according to claim 1.

* * * * *